(12) United States Patent
Jheng et al.

(10) Patent No.: US 11,251,283 B2
(45) Date of Patent: Feb. 15, 2022

(54) SEMICONDUCTOR STRUCTURE AND METHOD FOR MANUFACTURING THE SAME

(71) Applicant: UNITED MICROELECTRONICS CORP., Hsinchu (TW)

(72) Inventors: Pei-Lun Jheng, Tainan (TW); Chao-Sheng Cheng, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/832,945

(22) Filed: Mar. 27, 2020

(65) Prior Publication Data

US 2021/0305395 A1    Sep. 30, 2021

(51) Int. Cl.
*H01L 29/45* (2006.01)
*H01L 29/49* (2006.01)
*H01L 29/423* (2006.01)
*H01L 21/8234* (2006.01)
*H01L 27/088* (2006.01)

(52) U.S. Cl.
CPC .... *H01L 29/4933* (2013.01); *H01L 21/82345* (2013.01); *H01L 21/823443* (2013.01); *H01L 27/088* (2013.01); *H01L 29/42372* (2013.01); *H01L 29/456* (2013.01)

(58) Field of Classification Search
CPC ......... H01L 29/49; H01L 29/66; H01L 29/78; H01L 29/423; H01L 29/4933; H01L 29/42372; H01L 29/456; H01L 29/7833; H01L 29/665; H01L 29/66492; H01L 21/8234; H01L 21/82345; H01L 21/823443; H01L 27/088; H01L 29/45; H01L 29/495; H01L 29/4991; H01L 29/4958; H01L 29/435; H01L 29/4966; H01L 29/4975; H01L 29/66515; H01L 29/515; H01L 29/0843; H01L 29/0891; H01L 29/66507; H01L 29/7845; H01L 29/41791; H01L 29/66636; H01L 29/66643; H01L 21/28097; H01L 21/32051; H01L 21/32053; H01L 21/28079; H01L 21/28088; H01L 21/28061; H01L 21/823418; H01L 21/823425; H01L 21/8238; H01L 21/823814; H01L 21/28052; H01L 21/283443; H01L 21/823835; H01L 21/823475; H01L 21/823871
USPC .......................................................... 257/392
See application file for complete search history.

(56) References Cited

U.S. PATENT DOCUMENTS

| | | |
|---|---|---|
| 9,099,334 B2 | 8/2015 | Ishii et al. |
| 9,755,072 B2 | 9/2017 | Xue et al. |
| 10,411,025 B2 | 9/2019 | Matsubara |
| 2003/0049919 A1* | 3/2003 | Yamamoto .......... H01L 21/2807 438/592 |

(Continued)

*Primary Examiner* — Chuong A Luu
(74) *Attorney, Agent, or Firm* — WPAT, PC

(57) ABSTRACT

A semiconductor structure and a method for manufacturing the same are provided. The semiconductor structure includes a semiconductor substrate, a silicon-containing gate electrode, and at least two gate silicide strips. The silicon-containing gate electrode is on the semiconductor substrate. The at least two gate silicide strips are on an upper surface of the silicon-containing gate electrode.

9 Claims, 8 Drawing Sheets

(56) References Cited

U.S. PATENT DOCUMENTS

| | | | | |
|---|---|---|---|---|
| 2003/0198086 A1* | 10/2003 | Shukuri | ............ | H01L 27/11521 365/185.18 |
| 2005/0285181 A1* | 12/2005 | Yasui | .................... | H01L 27/115 257/315 |
| 2009/0090977 A1* | 4/2009 | Freeman | ............. | H01L 27/0629 257/379 |
| 2013/0034946 A1* | 2/2013 | Chuang | .................. | H01L 29/94 438/382 |
| 2013/0292780 A1* | 11/2013 | Pinto | .................. | H01L 27/0928 257/369 |
| 2015/0072489 A1* | 3/2015 | Baker, Jr. | .......... | H01L 27/11546 438/267 |
| 2016/0204223 A1* | 7/2016 | Xue | .................... | H01L 29/0653 438/294 |

\* cited by examiner

SEMICONDUCTOR STRUCTURE AND METHOD FOR MANUFACTURING THE SAME

BACKGROUND

Technical Field

The disclosure relates to a semiconductor structure and a method for manufacturing the same.

Description of the Related Art

With a trend of shrinking a line width of a semiconductor process, a size of a semiconductor structure, comprising for example a transistor or a memory array, etc., has been scaled down. However, manufacturing steps for the semiconductor structure have in increased with a variation trend of the semiconductor structure. The manufacturing steps become complicated, which results in difficulty in improving product efficiency. In addition, a design layout for the semiconductor structure also has an influence to an operating efficiency of a device.

SUMMARY

Accordingly, the present disclosure provides a semiconductor structure and a method for manufacturing the same.

According to an embodiment, a semiconductor structure is provided. The semiconductor structure comprises a semiconductor substrate, a silicon-containing gate electrode, and at least two gate silicide strips. The silicon-containing gate electrode is on the semiconductor substrate. The at least two gate silicide strips are on an upper surface of the silicon-containing gate electrode.

According to another embodiment, a semiconductor structure is provided. The semiconductor structure comprises a semiconductor substrate, a first transistor and a second transistor. The first transistor comprises a silicon-containing gate electrode and at least one gate silicide element. The silicon-containing gate electrode is on the semiconductor substrate. The at least one gate silicide element is on an upper surface of the silicon-containing gate electrode. The second transistor comprises a metal gate electrode on the semiconductor substrate.

According to yet another embodiment, a method for manufacturing a semiconductor structure is provided. The method comprises the following steps. A first silicon-containing gate electrode is formed on a semiconductor substrate in a first region. A second silicon-containing gate electrode is formed on the semiconductor substrate in a second region. A gate silicide element is formed on an upper surface of the first silicon-containing gate electrode. A source silicide element and a drain silicide element are formed on the semiconductor substrate on opposing sides of the second silicon-containing gate electrode respectively. The gate silicide element, the source silicide element and the drain silicide element are formed simultaneously.

Figure 1:
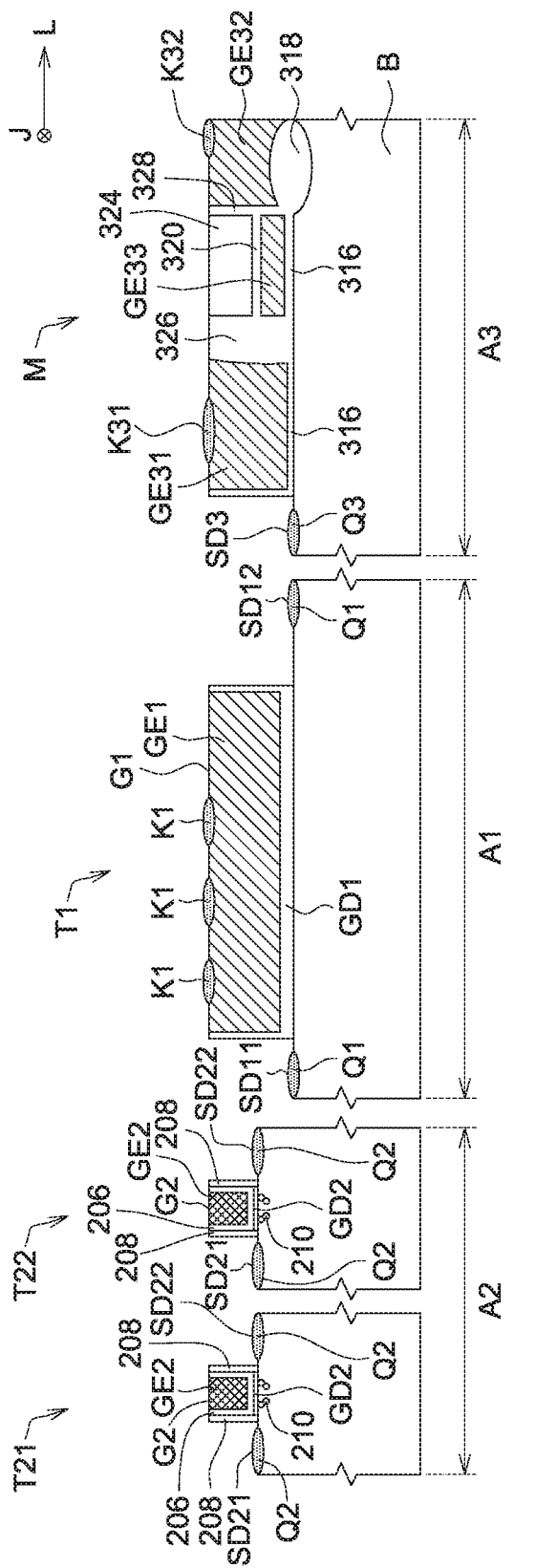
FIG. 1 illustrates a cross-section view of a semiconductor structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the disclosure are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

FIG. 1 illustrates a cross-section view of a semiconductor structure according to an embodiment. The semiconductor structure comprises a semiconductor substrate S. The semiconductor structure comprises a first transistor T1. The first transistor T1 may be formed on the semiconductor substrate B in a first region A1. In an embodiment, the first region A1 is for a high-voltage (HV) device. The first transistor T1 is a high-voltage transistor. The first transistor T1 may comprise a gate structure G1, a source/drain SD11, and a source/drain SD12.

The gate structure G1 comprises a gate dielectric layer GD1, a silicon-containing gate electrode GE1, and at least one gate silicide element K1. The gate dielectric layer GD1 is on the semiconductor substrate B. The silicon-containing gate electrode GE1 is on the gate dielectric layer GD1. The gate silicide element K1 is on an upper surface of the silicon-containing gate electrode GE1.

Figure 1A:
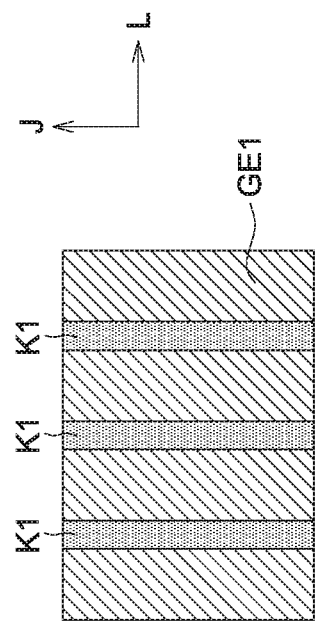
FIG. 1A shows a top view of a silicon-containing gate electrode and gate silicide elements.

FIG. 1A shows a top view of the silicon-containing gate electrode GE1 and the gate silicide elements K1. Referring to FIG. 1 and FIG. 1A, in an embodiment, the gate silicide element K1 (or the gate silicide elements K1) may have a strip shape having a long axis extending along a direction J, and may be referred to as a gate silicide strip (or gate silicide strips). In one embodiment, at least two gate silicide strips extending along the direction K are parallel to each other, and separated from each other in a direction L by the silicon-containing gate electrode GE1. The direction J may be substantially perpendicular to the direction L. The direction J may be a Y-diction, and the direction L may be a X-direction.

Referring to FIG. 1, the source/drain SD11 and the source/drain SD12 are on the semiconductor substrate B on opposing sides of the gate structure G1 respectively. The source/drain SD11 and the source/drain SD12 comprise silicide elements Q1 on the semiconductor substrate B. In embodiments, one source/drain of the source/drain SD11 and the source/drain SD12 is a source, and the silicide element Q1 of the one source/drain is referred to as a source silicide element. The other source/drain of the source/drain SD11 and the source/drain SD12 is a drain, and the silicide element Q1 of the other source/drain is referred to as a drain silicide element.

The semiconductor structure may comprise a second transistor T21 and a second transistor T22. The second transistor T21 and the second transistor T22 may be formed on the semiconductor substrate B in a second region A2. The second transistor T21 and the second transistor T22 are logic transistors. For example, the second transistor T21 is in an input/output (I/O) region. The second transistor T22 is in a core circuit region.

In embodiments, the second transistor T21 and the second transistor T22 comprise a gate structure G2, a source/drain SD21 and a source/drain SD22. The gate structure G2 may comprise a gate dielectric layer GD2, a barrier layer 206 and a metal gate electrodeGE2. The gate dielectric layer GD2 is on the semiconductor substrate B. The barrier layer 206 is on the gate dielectric layer GD2. The metal gate electrode GE2 is on the barrier layer 206. The gate structure G2 may comprise a gate spacer 208 on a sidewall surface of the barrier layer 206.

The source/drain SD21 and the source/drain SD22 are on the semiconductor substrate B on opposing sides of the gate structure G2 respectively. The source/drain SD21 and the source/drain SD22 comprise a silicide element Q2 on the semiconductor substrate B. The source/drain SD21 and the source/drain SD22 may comprise a pocket doped region 210 under the gate dielectric layer GD2. The source/drain SD21 and the source/drain SD22 may comprise heavily-doped regions (not shown) on the opposing sides of the gate structure G2 respectively, and the silicide elements Q2 are on the heavily-doped regions. The source/drain SD21 and the source/drain SD22 may comprise lightly-doped regions (not shown) on the opposing sides of the gate structure G2 respectively. The lightly-doped region may be extended under the gate dielectric layer GD2. In embodiments, one source/drain of the source/drain SD21 and the source/drain SD22 is a source, and the silicide element Q2 of the one source/drain is referred to as a source silicide element. The other source/drain of the source/drain SD21 and the source/drain SD22 is a drain, and the silicide element Q2 of the other source/drain is referred to as a drain silicide element.

The semiconductor structure further comprises a memory device M. The memory device M is on the semiconductor substrate B in a third region A3. The memory device M may comprise a silicon-containing gate electrode GE31 and a gate silicide element K31. The silicon-containing gate electrode GE31 is on an insulating layer 316 on the semiconductor substrate B. The gate silicide element K31 is on an upper surface of the silicon-containing gate electrode GE31. The memory device M may comprise a silicon-containing gate electrode GE32 and a gate silicide element K32. The silicon-containing gate electrode GE32 is on an insulating layer 318 on the semiconductor substrate B. The gate silicide element K32 is on an upper surface of the silicon-containing gate electrode GE32.

The memory device M may comprise a gate electrode GE33 on the insulating layer 316. A dielectric element 320 may be on the gate electrode GE33. A dielectric element 324 may be on the dielectric element 320. A dielectric element 326 may be on sidewalls of the gate electrode GE33, the dielectric element 320 and the dielectric element 324. The silicon-containing gate electrode GE31 and the gate electrode GE33 may be separated from each other by the dielectric element 326. A dielectric element 328 may be on sidewalls of the gate electrode GE33, the dielectric element 320 and the dielectric element 324. The silicon-containing gate electrode GE32 and the gate electrode GE33 may be separated from each other by the dielectric element 328.

In an embodiment, the memory device M is a flash memory device. The silicon-containing gate electrode GE31 may be functioned as a word line (WL) for the memory device M. The silicon-containing gate electrode GE32 may be functioned as an erasing gate electrode for the memory device M. The gate electrode GE33 may be functioned as a floating gate electrode for the memory device M. In an embodiment, the gate electrode GE33 comprises a silicon-containing material, such as polysilicon, single-crystal silicon, or any suitable silicon-containing semiconductor material, or other suitable conductive materials such as a metal and so on. The memory device M may comprise a source/drain SD3 comprising a silicide element Q3 on the semiconductor substrate B.

In an embodiment, an upper surface of the semiconductor substrate B in the first region A1 and the third region A3 is at a level below than a level at which an upper surface of the semiconductor substrate B in the second region A2 is as shown in FIG. 1. For example, an interface between the semiconductor substrate B and the gate dielectric layer GD1 of the first transistor T1 is below an interface between the semiconductor substrate B and the gate dielectric layer GD2 of the second transistor T21 or the second transistor T22.

In embodiments, the semiconductor substrate B may comprise a silicon-containing material capable of being treated with a silicidation step to form the silicide element Q1, the silicide element Q2 and the silicide element Q3 for the source/drain SD11, the source/drain SD12, the source/drain SD21, the source/drain SD22 and the source/drain SD3. For example, the semiconductor substrate B may comprise a silicon substrate, a silicon-on-insulator (SOI) substrate, or any suitable silicon-containing semiconductor material.

In embodiments, the silicon-containing gate electrode GE1, the silicon-containing gate electrode GE31, and the silicon-containing gate electrode GE32 may comprise a silicon-containing material capable of being treated with a silicidation step to form the gate silicide elements K1, K31 and K32. For example, the silicon-containing gate electrode GE1, the silicon-containing gate electrode GE31, and the silicon-containing gate electrode GE32 may individually comprise a polysilicon, single-crystal silicon, or any suitable silicon-containing semiconductor material.

In an embodiment, active regions for the first transistor T1, the second transistor T22, the second transistor T22 and the memory device M may be defined by a shallow trench isolation (STI) formed in the semiconductor substrate B, or other suitable isolation structures.

FIG. 2 to FIG. 8 illustrate a method for manufacturing the semiconductor structure according to an embodiment.

Figure 2:
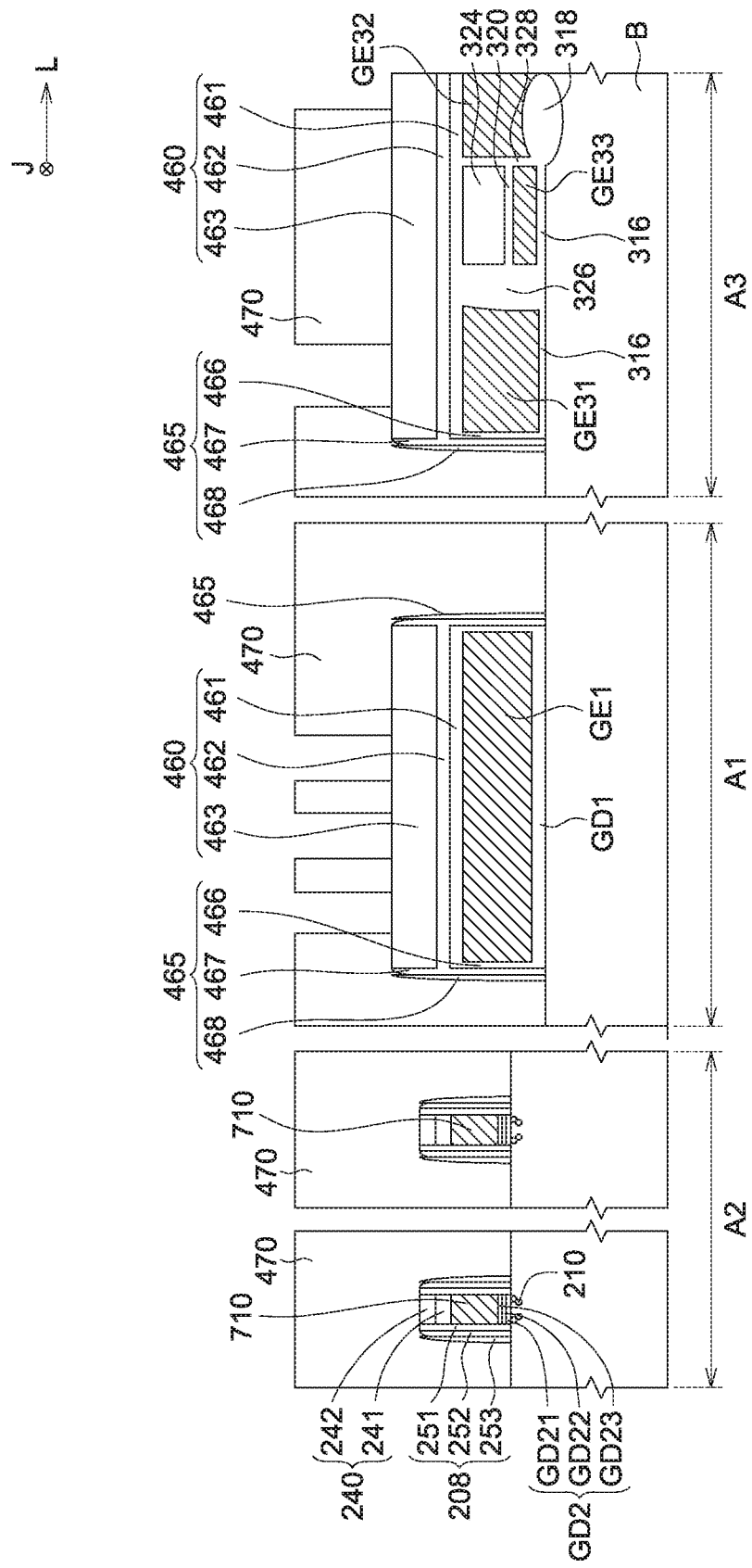
FIG. 2 to FIG. 8 illustrate a method for manufacturing a semiconductor structure according to an embodiment.

Referring to FIG. 2, the gate dielectric layer GD1 and the insulating layer 316 are formed on the semiconductor substrate B in the first region A1 and the third region A3 respectively. The gate dielectric layer GD1 and the insulating layer 316 may be formed by a deposition method such as a CVD method, a PVD method, or other suitable methods. In an embodiment, the gate dielectric layer GD1 and the insulating layer 316 may comprise an oxide such as silicon oxide, or other suitable materials comprising a nitride such as silicon nitride, and so on. The insulating layer 318 may be formed on the semiconductor substrate B in the third region A3. The insulating layer 318 may comprise a FOX structure as shown in the drawing, but is not limited thereto. The gate electrode GE33 is formed on an upper surface of the insulating layer 316. The dielectric element 320 is formed on an upper surface of the gate electrode GE33. The dielectric element 324 is formed on an upper surface of the dielectric element 320. The dielectric element 326 and the dielectric element 328 are formed on the sidewall surfaces of the gate electrode GE33, the dielectric element 320 and the dielectric element 324.

The silicon-containing gate electrode GE1 (first silicon-containing gate electrode) is formed on the gate dielectric layer GD1 in the first region A1. The silicon-containing gate electrode GE31 (third silicon-containing gate electrode) is formed on the insulating layer 316 in the third region A3. The silicon-containing gate electrode GE32 (third silicon-containing gate electrode) is formed on the insulating layer 318 in the third region A3. The gate dielectric layer GD2 is formed on the semiconductor substrate B in the second region A2. In an embodiment, the gate dielectric layer GD2 may comprise a first dielectric film GD21 formed on the semiconductor substrate B, a second dielectric film GD22 formed on the first dielectric film GD21, and a third dielectric film GD23 formed on the second dielectric film GD22. The first dielectric film GD21, the second dielectric film GD22, and the third dielectric film GD23 may individually comprise an oxide such as silicon oxide, a nitride such as silicon nitride, or other suitable dielectric materials. A dummy gate 710 is formed on the gate dielectric layer GD2. In an embodiment, the dummy gate 710 comprises a silicon-containing material such as polysilicon, single-crystal silicon, or the like, and can be referred to as dummy silicon-containing gate electrode (second silicon-containing gate electrode). A cover element 240 is on an upper surface of the dummy gate 710. The dummy gate 710 may be formed through a patterning step with using the cover element 240 as a hard mask. The cover element 240 may comprise a nitride film 241 formed on the dummy gate 710, and an oxide film 242 formed on the nitride film, but is not limited thereto. The nitride film 241 may comprise silicon nitride or other suitable materials. The oxide film 242 may comprise silicon oxide or other suitable materials. The pocket doped region 210 may be formed in the semiconductor substrate B under the dummy gate 710 with a dopant implanting process. The gate spacer 208 may be formed on sidewalls of the gate dielectric layer GD2, the dummy gate 710 and the cover element 240. The gate spacer 208 may comprise a first gate spacer 251 formed on the sidewalls of the gate dielectric layer GD2, the dummy gate 710 and the cover element 240, a second gate spacer 252 formed on the first gate spacer 251, and a third gate spacer 253 formed on the second gate spacer 252, but is not limited thereto. The first gate spacer 251, the second gate spacer 252 and the third gate spacer 253 may individually comprise an oxide such as silicon oxide, a nitride such as silicon nitride, or other suitable dielectric materials.

Figure 3:
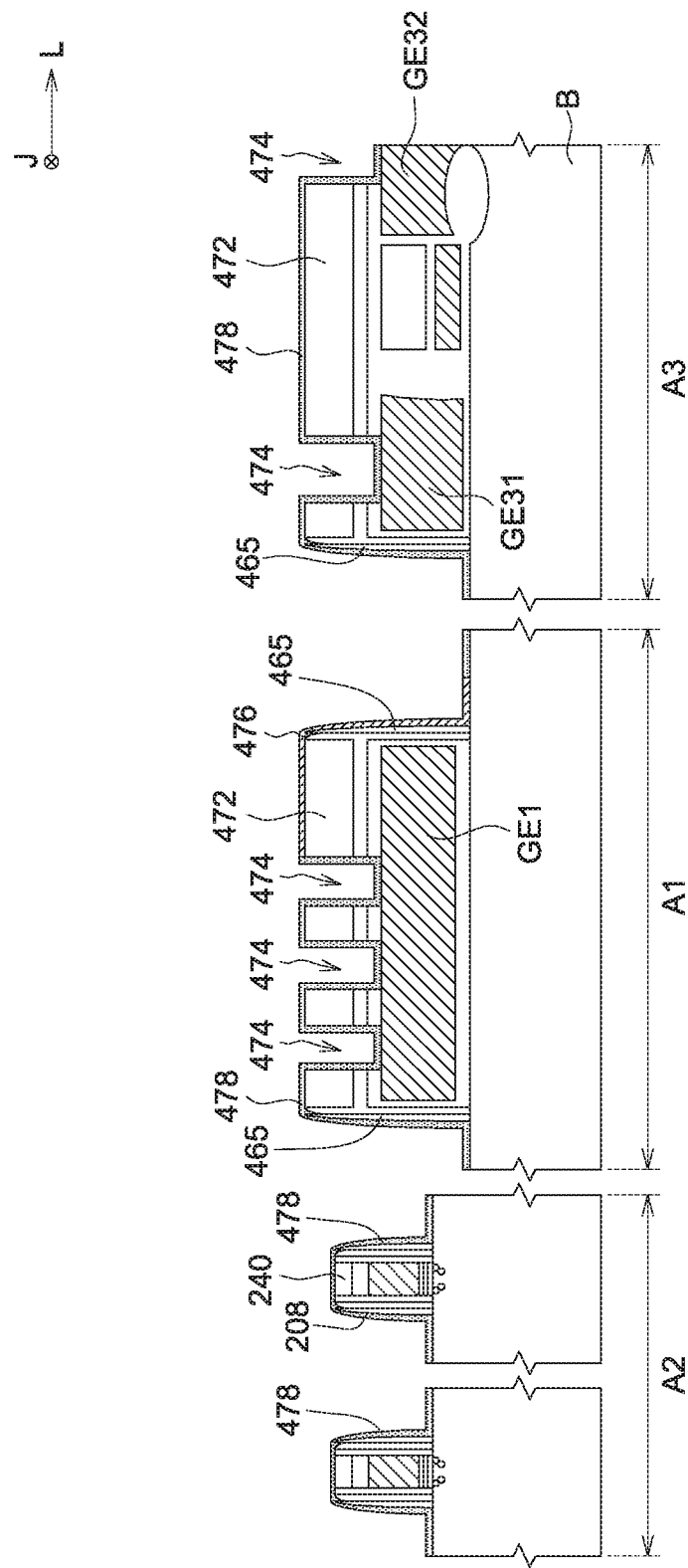

In an embodiment, the silicon-containing gate electrode GE1, the silicon-containing gate electrode GE31, and the silicon-containing gate electrode GE32 may be formed simultaneously by a method comprising depositing a silicon-containing material layer (not shown), forming a hard mask layer 460 on an upper surface of the silicon-containing material layer, patterning the hard mask layer 460 with using a lithography etching step, and then transferring a pattern of the hard mask layer 460 down into the silicon-containing material layer. The hard mask layer 460 may comprise an oxide film 461, a nitride film 462 formed on the oxide film 461, and an oxide film 463 formed on the nitride film 462, but is not limited thereto. The oxide film 461 and the oxide film 463 may comprise silicon oxide or other suitable materials. The nitride film 462 may comprise silicon nitride or other suitable material. While the lithography etching step for patterning the hard mask layer 460 and the pattern-transferring step are performed, the second region A2 may be covered by a photo resist layer (not shown) to protect the dummy gate 710, the cover element 240 and the gate spacer 208. After the silicon-containing material layer is patterned to define the silicon-containing gate electrode GE1, the silicon-containing gate electrode GE31, and the silicon-containing gate electrode GE32, the photo resist layer may be removed. A spacer 465 may be formed on sidewalls of the silicon-containing gate electrode GE1, the silicon-containing gate electrode GE31, and the hard mask layer 460. The spacer 465 may comprise an oxide film 466, a nitride film 467 formed on the oxide film 466, and an oxide film 468 formed on the nitride film 467, but is not limited thereto. The oxide film 466 and the oxide film 468 may comprise silicon oxide or other suitable materials. The nitride film 467 may comprise silicon nitride or other suitable material. A photo resist layer 470 may be formed to cover the first region A1, the second region A2, and the third region A3. A pattern of the photo resist layer 470 may be transferred down into the hard mask layer 460 so as to form a patterned structure 472 as shown in FIG. 3. Then the photo resist layer 470 may be removed.

Figure 4:
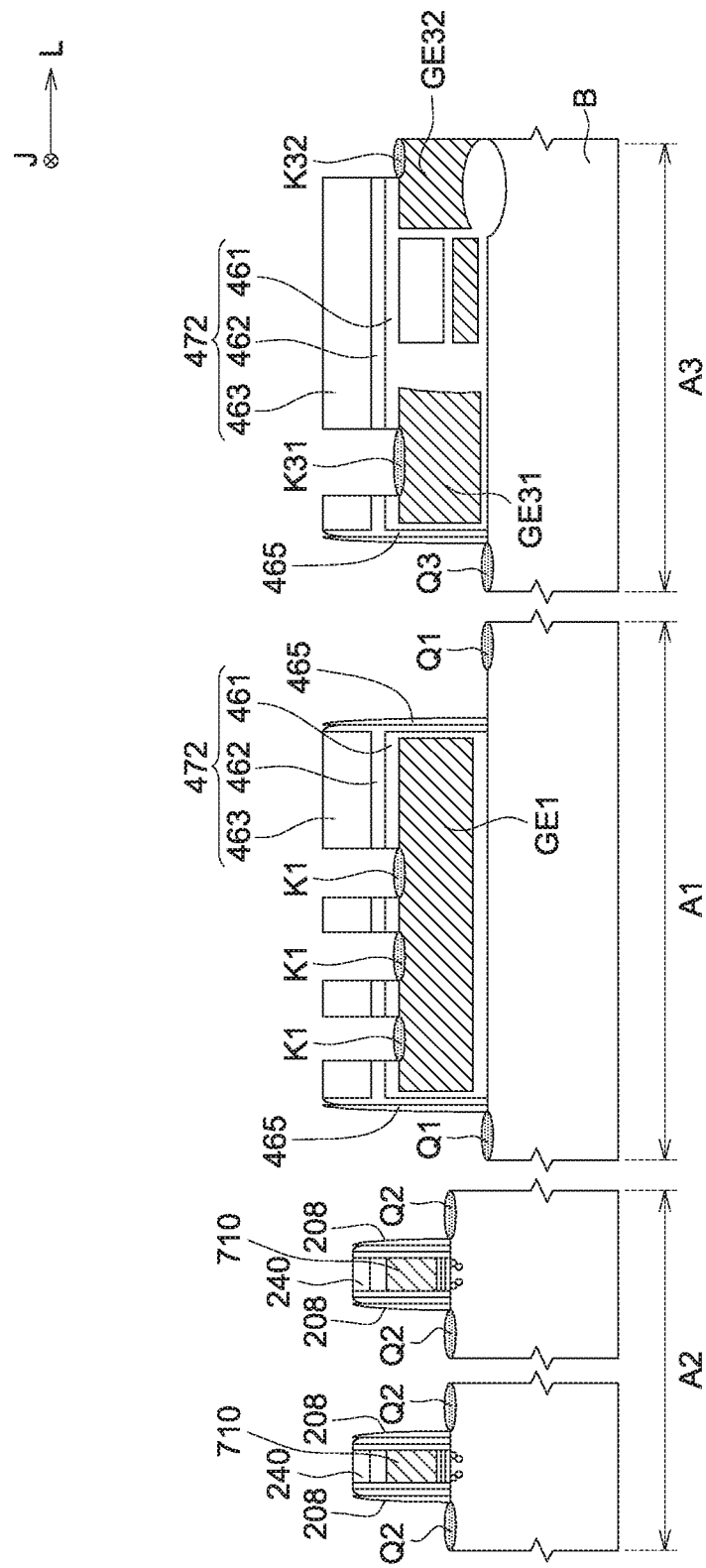

Referring to FIG. 3, the patterned structure 472 defines slits 474 exposing the upper surfaces of the silicon-containing gate electrode GE1, the silicon-containing gate electrode GE31 and the silicon-containing gate electrode GE32. In an embodiment, the patterned structure 472 defines at least two slits 474 exposing the upper surface of the silicon-containing gate electrode GE1. A protect film 476 may be formed to cover the upper surface of the semiconductor substrate B adjacent to the silicon-containing gate electrode GE1. The protect film 476 may be extended on the spacer 465 and the patterned structure 472 on the silicon-containing gate electrode GE1. The protect film 476 may be formed by a method comprising depositing an oxide film (such as silicon oxide and so on) by a plasma-enhanced and then pattering the oxide film with a lithography etching (such as a wet etching or a dry etching) process. An implanting process may be performed to dope exposed portions of the semiconductor substrate B, the silicon-containing gate electrode GE1, the silicon-containing gate electrode GE31, and the silicon-containing gate electrode GE32. A pre-clean step may be performed. A metal layer 478 may be formed to cover the exposed portions of the semiconductor substrate B, the silicon-containing gate electrode GE1, the silicon-containing gate electrode GE31, and the silicon-containing gate electrode GE32, and the spacer 465, the patterned structure 472, the gate spacer 208 and the cover element 240. The metal layer 478 may be formed by a sputtering method or other suitable methods. The metal layer 478 may comprise a metal or an alloy such as NiPt, TiAl, ZrAl, WAl, TaAl, HfAl, TiAlC, TiN, TaN, etc., but is not limited thereto. A thermal step (such as a rapid thermal step) is performed to form the silicide elements Q1 on the semiconductor substrate B on the opposing sides of the silicon-containing gate electrode GE1 in the first region A1, the gate silicide elements K1 on the silicon-containing gate electrode GE1, the silicide elements Q2 on the semiconductor substrate B on the opposing sides of the dummy gate 710 in the second region A2, the silicide element Q3 on the semiconductor substrate B in the third region A3, the gate silicide element K31 on the silicon-containing gate electrode GE31, and the gate silicide element K32 on the silicon-containing gate electrode GE32 as shown in FIG. 4. In embodiments, the silicide element Q1 adjacent to the protect film 476 is pulled back by the protect film 476, and therefore the first transistor T1 (such as a HV transistor shown FIG. 1) can have ability sustaining a higher voltage with such arrangement. Then, a remained portion of the metal layer 478 not reacting with the semiconductor substrate B and the protect film 476 may be removed. In embodiments, the silicide element Q1, the gate silicide element K1, the silicide element Q2, the silicide element Q3, the gate silicide element K31, and the gate silicide element K32 are formed simultaneously. The spacer 465 may be removed.

Figure 5:
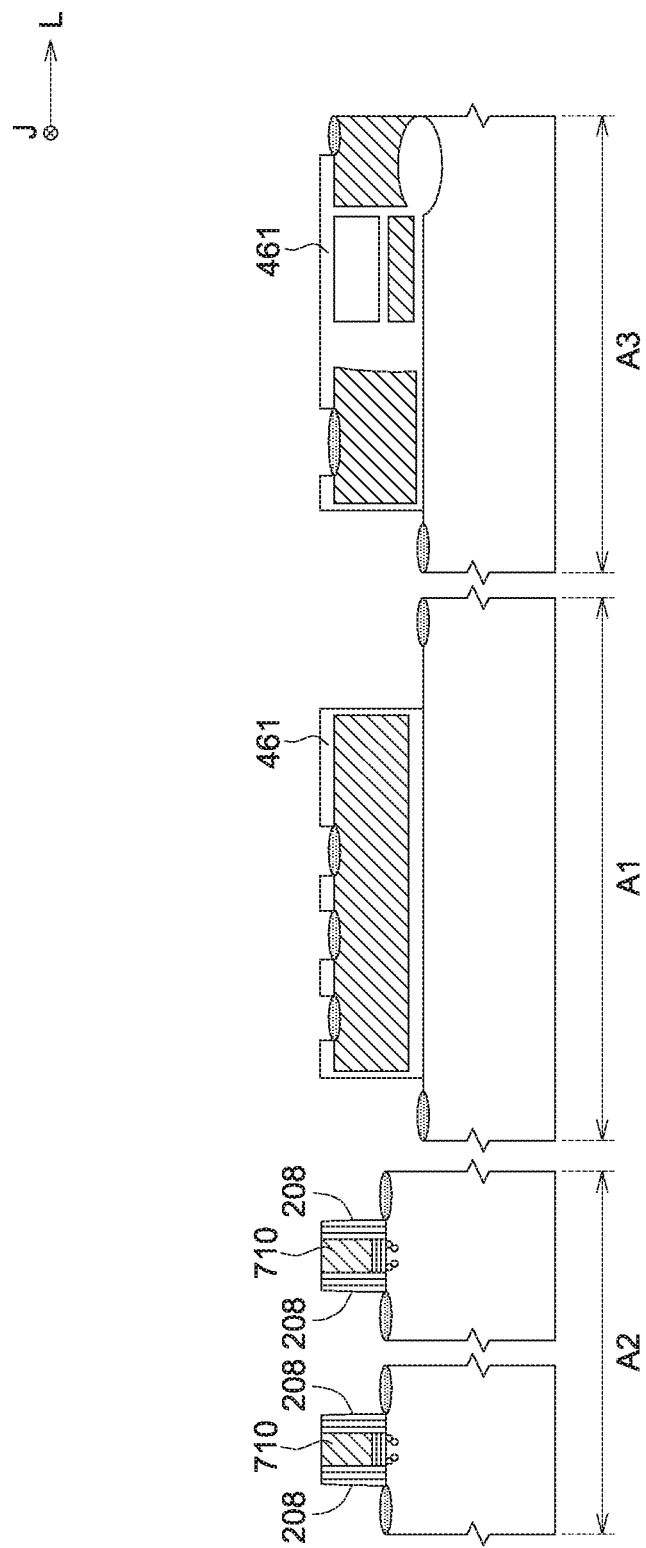

Referring to FIG. 5, next, the cover element 240 is removed to expose the dummy gate 710 by an etching step. In an embodiment, portions of the patterned structure 472 and the gate spacer 208 above the dummy gate 710 may be removed along with the etching step for removing the cover element 240. The etching step may comprise a chemical-mechanical planarization step. In an embodiment, the chemical-mechanical planarization step may use the nitride film 462 (FIG. 4) as a stop layer. The spacer 465 (FIG. 4) is removed by an etching method.

Figure 6:
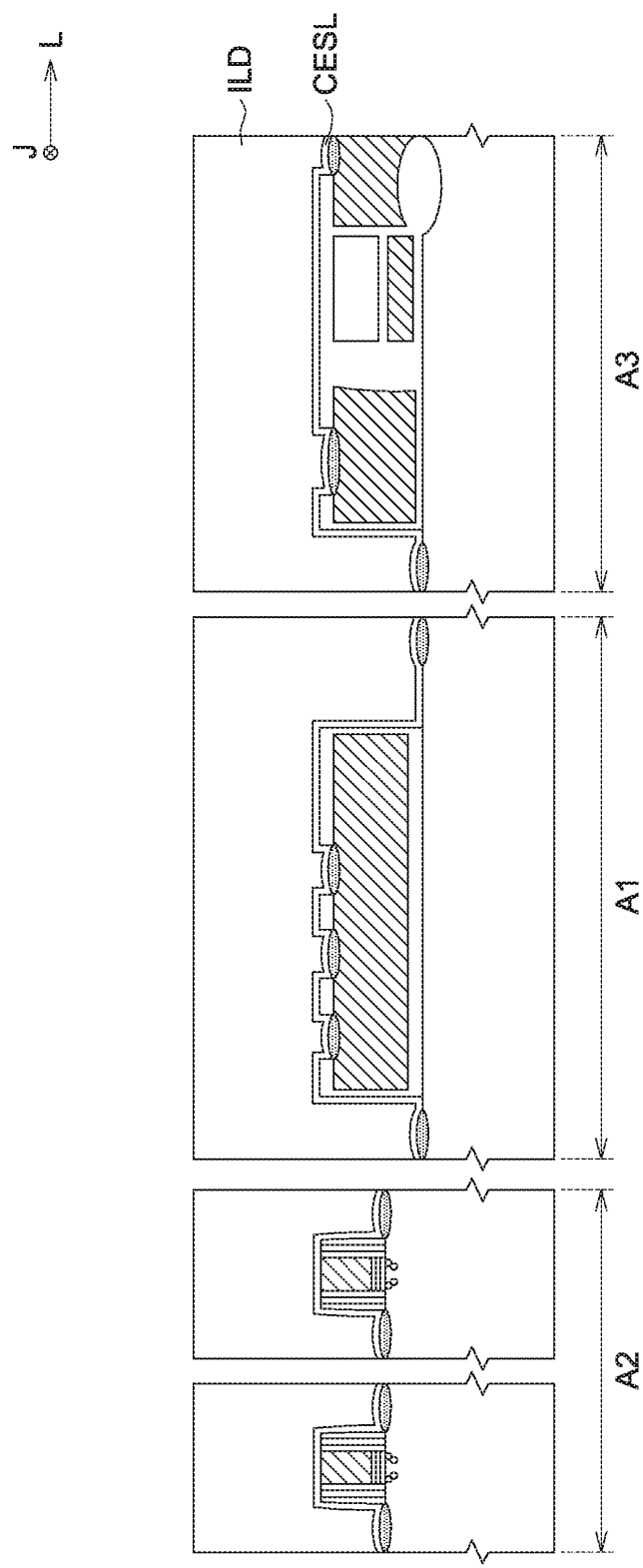

Referring to FIG. 6, a contact etch stop layer CESL may be formed. The contact etch stop layer CESL may comprise a nitride such as silicon nitride, or other suitable dielectric materials. An inter-layer dielectric layer ILD may be formed over the contact etch stop layer CESL. The inter-layer dielectric layer ILD may comprise an oxide such as silicon oxide, or other suitable dielectric materials.

Figure 7:
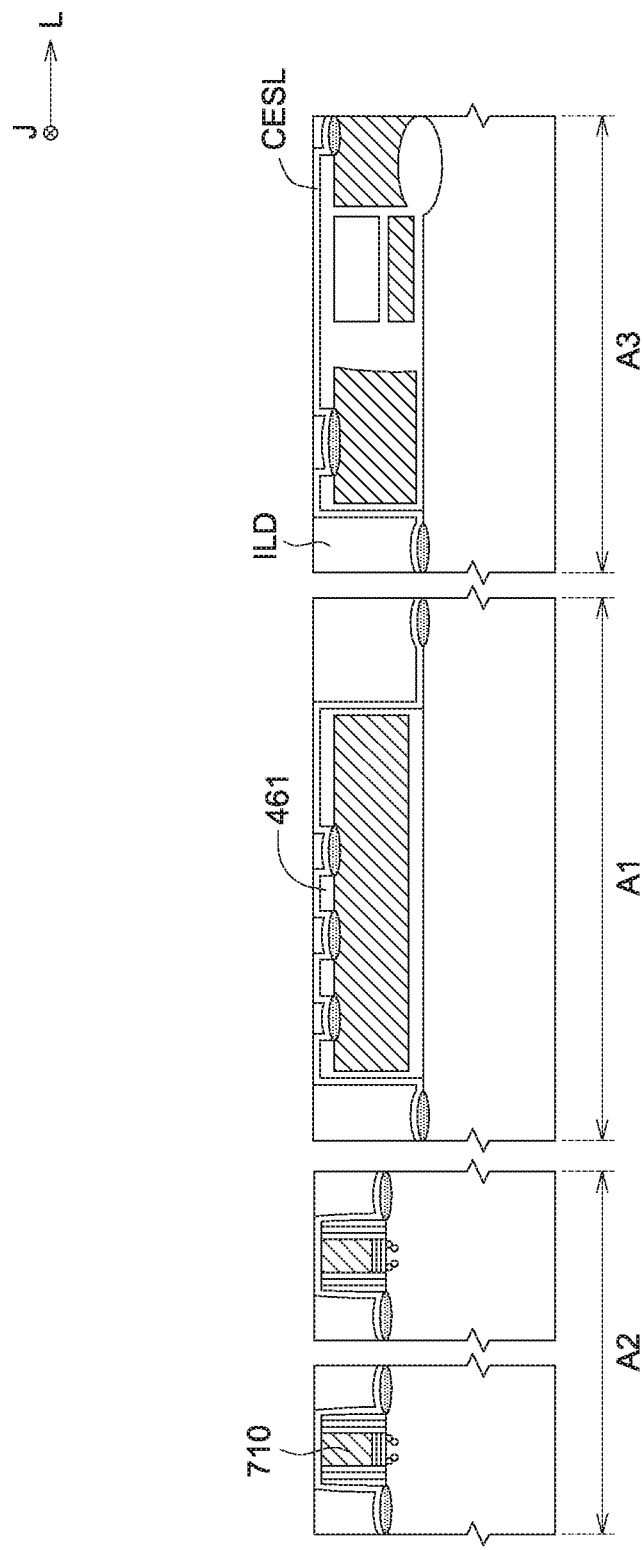

Referring to FIG. 7, a chemical-mechanical planarization step may be performed from an upper surface of the inter-layer dielectric layer ILD down to the contact etch stop layer CESL. Then, the dummy gate 710 is removed.

Figure 8:
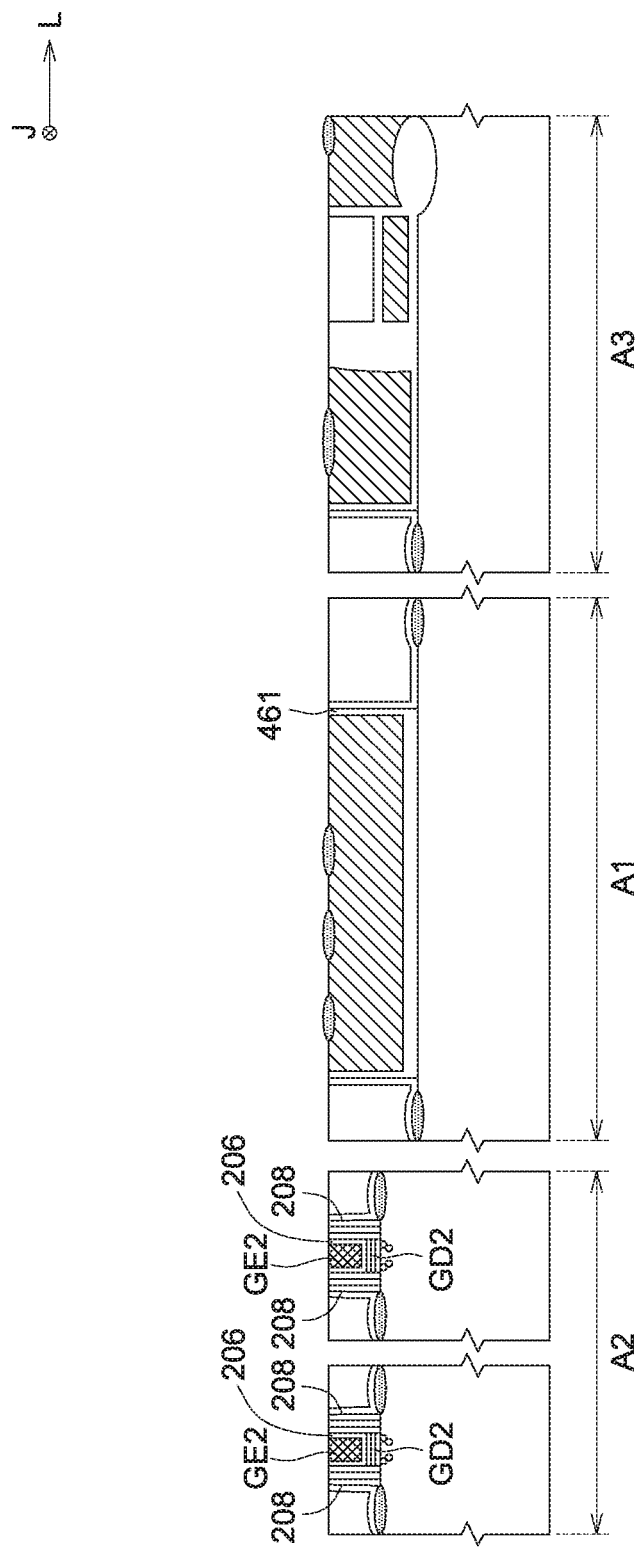

Referring to FIG. 8, the barrier layer 206 may be formed on the upper surface of the gate dielectric layer GD2 and a sidewall surface of the gate spacer 208. The barrier layer 206 may comprise a metal or an alloy, such as TaN, TiN, Ti, Ta, Cu, Al, W, TiAl, CoWP, or other suitable materials. In an embodiment, the barrier layer 206 may comprise a TaN film formed on the upper surface of the gate dielectric layer GD2 and the sidewall surface of the gate spacer 208, and a TiN film formed on the TaN film. The barrier layer 206 is not limited thereto. The metal gate electrode GE2 may be formed on the barrier layer 206. In an embodiment, the barrier layer 206 and the metal gate electrode GE2 may be flattened by a chemical-mechanical planarization step using the oxide film 461 as a stop layer.

It should be noted that the above methods present forming the gate dielectric layer GD2 at first (namely, a high-K first process). However, those skilled in the art can realize that, in the present invention, it is also available to form a high-k gate dielectric layer (not shown) after removing the dummy gate (namely, a high-K last process). In an embodiment, after removing the dummy gate 710 and before forming the barrier layer 206, the gate dielectric layer GD2 may be removed and a U-shaped gate dielectric layer (not shown) may be formed. The U-shaped gate dielectric layer may comprise a high-k dielectric material including a rare earth metal oxide or a lanthanide oxide, such as hafnium oxide ($HfO_2$), and will form a U shape in the cross section.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a semiconductor substrate;
   a first gate dielectric layer, disposed on and directly contacted to the semiconductor substrate;
   a silicon-containing gate electrode on the first gate dielectric layer;
   at least two gate silicide strips separated from each other and directly contacting to an upper surface of the silicon-containing gate electrode;
   a second gate dielectric layer, disposed on and directly contacted to the semiconductor substrate;
   a metal gate electrode, disposed on the second gate dielectric layer; wherein an interface between the semiconductor substrate and the first gate dielectric layer is below an interface between the semiconductor substrate and the second gate dielectric layer; and
   a source and a drain on the semiconductor substrate on opposing sides of the silicon-containing gate electrode respectively.

2. The semiconductor structure according to claim 1, wherein the at least two gate silicide strips are parallel to each other and separated from each other by the silicon-containing gate electrode.

3. The semiconductor structure according to claim 1, wherein each of the source and the drain comprises a silicide element on the semiconductor substrate.

4. A semiconductor structure, comprising:
   a semiconductor substrate;
   a first transistor comprising:
      a first gate dielectric layer disposed on and directly contacted to the semiconductor substrate;
      a silicon-containing gate electrode on the first gate dielectric layer; and
      at least two gate silicide elements separated from each other and directly contacting to an upper surface of the silicon-containing gate electrode; and
   a second transistor comprising:
      a second gate dielectric layer disposed on and directly contacted to the semiconductor substrate; and
      a metal gate electrode on the second gate dielectric layer;
   wherein an interface between the semiconductor substrate and the first gate dielectric layer is below an interface between the semiconductor substrate and the second gate dielectric layer.

5. The semiconductor structure according to claim 4, wherein each of the at least two gate silicide elements is a gate silicide strip, the first transistor comprises at least two the gate silicide strips on the upper surface of the silicon-containing gate electrode, the at least two gate silicide strips are parallel to and separated from each other.

6. The semiconductor structure according to claim 4, wherein the first transistor is a high-voltage transistor, the second transistor is a logic transistor, the semiconductor structure further comprises a memory device, the memory device comprises another silicon-containing gate electrode and another gate silicide element on an upper surface of the another silicon-containing gate electrode.

7. The semiconductor structure according to claim 4, wherein the second transistor comprises:
   a gate structure comprising a gate dielectric layer and the metal gate electrode on the gate dielectric layer; and
   a source silicide element and a drain silicide element on the semiconductor substrate on opposing sides of the gate structure respectively.

8. The semiconductor structure according to claim 4, wherein the first transistor comprises a first gate structure comprising the first gate dielectric layer, the at least two gate silicide elements and the silicon-containing gate electrode; and the second transistor comprises a second gate structure comprising the metal gate electrode and the second gate dielectric layer.

9. The semiconductor structure according to claim 4, wherein each of the first transistor and the second transistor further comprises a source and a drain on the semiconductor substrate on opposing sides of the gate structure respectively, each of the source and the drain of the second transistor and the source and the drain of the first transistor comprises a silicide element on the semiconductor substrate.

* * * * *